United States Patent [19]
Nakai et al.

[11] Patent Number: 5,530,397
[45] Date of Patent: Jun. 25, 1996

[54] REFERENCE VOLTAGE GENERATING CIRCUIT OF SEMICONDUCTOR MEMORY DEVICE

[75] Inventors: Jun Nakai; Yuto Ikeda; Takeshi Kajimoto; Yuichiro Komiya, all of Hyogo, Japan

[73] Assignee: Mitsubishi Denki Kabushiki Kaisha, Tokyo, Japan

[21] Appl. No.: 280,971

[22] Filed: Jul. 27, 1994

[30] Foreign Application Priority Data

Oct. 29, 1993 [JP] Japan ................................ 5-272038

[51] Int. Cl.[6] ................................................ G05F 3/02
[52] U.S. Cl. ..................... 327/545; 327/538; 327/541; 327/543
[58] Field of Search ........................... 327/143, 530, 327/538, 540, 541, 543, 545, 546

[56] References Cited

U.S. PATENT DOCUMENTS

| | | | |
|---|---|---|---|
| 4,495,425 | 1/1985 | McKenzie | 327/542 |
| 5,155,384 | 10/1992 | Ruetz | 327/143 |
| 5,243,231 | 9/1993 | Baik | 327/537 |
| 5,300,822 | 4/1994 | Sugahara et al. | 327/143 |
| 5,304,861 | 4/1994 | Fruhauf et al. | 327/538 |
| 5,391,979 | 2/1995 | Kajimoto et al. | 327/543 |

FOREIGN PATENT DOCUMENTS 0564280  10/1993  European Pat. Off. .......... G11C 5/14

OTHER PUBLICATIONS

Hideto Hidaka et al, "A 34-ns 16-Mb DRAM with Controllable Voltage Down Converter", IEEE Journal of Solid-State Circuits, vol. 27, No. 7, Jul. 1992, pp. 1020–1026.

*Primary Examiner*—Terry Cunningham
*Attorney, Agent, or Firm*—Lowe, Price, LeBlanc & Becker

[57] ABSTRACT

A reference voltage generating circuit of a DRAM includes a current mirror circuit constituted of first to fourth transistors. The gate of the third transistor is connected to the source of a fifth transistor. When a zero-power on reset signal, which becomes L on turn-on of the power supply, and becomes H after a predetermined period, is applied to the gate of the fifth transistor, and an external power supply voltage is forced to be applied to the gate of the third transistor on turn-on of the power supply, a reference voltage following the rise of the external power supply voltage is provided from the output of the current mirror circuit.

7 Claims, 6 Drawing Sheets

REFERENCE VOLTAGE GENERATING CIRCUIT OF SEMICONDUCTOR MEMORY DEVICE

BACKGROUND OF THE INVENTION

1. Field of the Invention

The present invention relates to reference voltage generating circuits of semiconductor memory devices. The present invention relates more particularly to a reference voltage generating circuit employed in a semiconductor device, such as a dynamic random access memory (DRAM), and generating a reference voltage for obtaining an internal power supply voltage (Int.Vcc) from an external power supply voltage (Ext.Vcc).

2. Description of the Background Art

FIG. 8 is a block diagram showing one example of a conventional DRAM. In FIG. 8, the DRAM includes a state detecting circuit 1, a clock generating circuit 2, a gate 3, a row and column address buffer 4, a row decoder 5, a column decoder 6, a sense refresh amplifier and input/output control circuit 7, a memory cell array 8, an input buffer 9, an output buffer 10, an internal voltage-down lowering circuit 11, and a zero-power on reset circuit 15. The DRAM thus structured performs a prescribed operation in response to a column address strobe signal/CAS ("/" indicates an inverted signal), a row address strobe signal/RA;, and a write enable signal /WE, to store data in a prescribed memory cell in memory cell array 8, which corresponds to row and column addresses designated by address signals A0 to A11, and to read out data stored therein. Data to be stored is applied to a memory cell in memory cell array 8 through input buffer 9, and data to be read out is provided through output buffer 10. Internal voltage-down lowering circuit 11 converts an external power supply voltage (Ext.Vcc) down to an internal power supply voltage (Int.Vcc). Zero-power on reset signal generating circuit 15 generates a zero-power on reset signal upon turn-on of the power supply.

FIG. 9 is a schematic diagram showing one example of the internal voltage-down lowering circuit shown in FIG. 8. In FIG. 9, internal voltage-down lowering circuit 11 includes a reference voltage generating circuit 12, a current mirror circuit 13 and i driver 14. Reference voltage generating circuit 12, in response to the external power supply voltage Ext.Vcc, generates a reference voltage, and provides the reference voltage to current mirror circuit 13. Current mirror circuit 13 includes transistors Tr11 to Tr14 and a constant current source J1. By an output of current mirror circuit 13 driven is driver 14. Driver 14 includes a transistor Tr15, and is connected to a constant current source J2.

The operation of internal voltage-down lowering circuit 11 shown in FIG. 9 will now be described. When an internal power supply voltage provided from a node N1 becomes higher than a reference voltage provided from reference voltage generating circuit 14, a value of a current flowing through transistor Tr14 is larger than a value of a current flowing through transistor Tr13. Accordingly, a potential of a node N2 is increased, so that transistor Tr15 of driver 14 is rendered conductive lightly, or non-conductive. This results in decrease or stop of current supply from transistor Tr15 to node N1, reducing the internal power supply voltage to the same level as the reference voltage.

Conversely, when an internal power supply voltage becomes lower than a reference voltage, a value of a current flowing through transistor Tr14 is smaller than that flowing through transistor Tr13, so that a potential of node N2 is reduced, rendering transistor Tr15 conductive. This provides enough current supply from transistor 15 to node N1, increasing the internal power supply voltage up to the same level as the reference voltage.

FIG. 10 is a schematic diagram showing one example of the reference voltage generating circuit shown in FIG. 9. Referring to FIG. 10, the external power supply voltage Ext.Vcc is applied to the source of a p-channel transistor Tr1 through a resistance R1. Transistor Tr1 has its drain connected to the drain and the gate of an n-channel transistor Tr2. The transistor Tr2 has its source grounded. A connection of resistance R1 and the source of transistor Tr1 is connected to the gate of a p-channel transistor Tr3. The source of transistor Tr3 is supplied with the external power supply voltage Ext.Vcc, and the drain of transistor Tr3 is connected to the gate of transistor Tr1 and the drain of an n-channel transistor Tr4. The gate of transistor Tr4 is supplied with the external power supply voltage Ext.Vcc, and the source of transistor Tr4 is grounded.

Transistor Tr2 has its drain connected to the gate of an n-channel transistor Tr6. Transistor Tr6 has its drain connected to the drain and the gate of a p-channel transistor Tr5 and the gate of a p-channel transistor Tr7, and has its source grounded. The sources of transistor Tr5 and the transistor Tr7 are supplied with the external power supply voltage Ext.Vcc. Transistor Tr7 has its drain connected to the source of a p-channel transistor Tr8 having a small current driving power. Transistor Tr8 has its drain and source grounded. A reference voltage is provided from a connection of the drain of transistor Tr7 and the source of transistor Tr8.

The description will now be made on the operation of the conventional reference voltage generating circuit shown in FIG. 10. When the external power supply voltage Ext.Vcc rises to a certain level after turn-on of the power supply, a current I=Vtp/R flows through resistance R1 and transistors Tr1 and Tr2, where Vtp is a threshold voltage of transistor Tr3 and R is a resistance value of resistance R1. Such a current flow causes a current flow through transistors Tr3 and Tr4. Conduction of transistor Tr2 renders also transistor Tr6 conductive, and a current also flows through transistors Tr5 and Tr6. This renders transistor Tr7 conductive, and a current flows through transistors Tr7 and Tr8, so that a reference voltage is provided from the connection of transistors Tr7 and Tr8.

FIG. 11 is a graph showing rising characteristics of the external power supply voltage Ext.Vcc and the internal power supply voltage Int.Vcc provided based on the reference voltage from the reference voltage generating circuit. In the conventional reference voltage generating circuit shown in FIG. 10, when the external power supply voltage Ext.Vcc attains a certain level upon turn-on of the power supply, a current I=Vtn/R flows, so that the reference voltage rapidly rises and the internal power supply voltage Int.Vcc also rises rapidly as shown in FIG. 11, which causes a latch-up.

SUMMARY OF THE INVENTION

An object of the present invention is to provide a reference voltage generating circuit generating a reference voltage, following rising characteristics of an external power supply voltage.

The reference voltage generating circuit in accordance with the present invention includes a first circuit having a resistance, a first transistor of a first conductivity type, and a second transistor of a second conductivity type connected between a power supply and a ground; a current mirror circuit including third and fourth transistors of the first conductivity type, and having first electrodes of the third and fourth transistors connected to the power supply; a fifth transistor of the second conductivity type having its input electrode connected to a first electrode of the second transistor included in the first circuit, its first electrode connected to a second electrode of the third transistor included in the current mirror circuit, and its second electrode grounded; a sixth transistor of the first conductivity type in which its input electrode is grounded, its first electrode is connected to a second electrode of the fourth transistor included in the current mirror circuit, and provides a reference voltage, and its second electrode is grounded; and a control circuit for controlling the reference voltage provided from the first electrode of the sixth transistor upon turn-on of the power supply so that it follows rising characteristics of the power supply.

According to the present invention, the reference voltage provided from the current mirror circuit upon turn-on of the power supply is controlled so as to follow rising characteristics of the power supply, whereby latch-up cannot take place when generating an internal power supply voltage of a DRAM.

Preferably, the control circuit includes a control element controlling conduction of the sixth transistor in response to rising characteristics of the power supply. The control element includes a seventh transistor of the first conductivity type connected between an input electrode of the fifth transistor and the power supply, and conducting during a predetermined period after turn-on of the power supply, to provide the power supply voltage to the input electrode of the fifth transistor.

The control element further includes an eighth transistor of the second conductivity type connected between an input electrode of the fourth transistor included in the current mirror circuit and the ground, and conducting during a predetermined period after turn-on of the power supply, to render the fourth transistor conductive.

More preferably, the control circuit includes a ninth transistor of the first conductivity type whose first electrode is supplied with a voltage corresponding to a half of the power supply voltage, whose second electrode is connected to the first electrode of the sixth transistor, and which conducts during a predetermined period after turn-on of the power supply to provide a reference voltage rising in response to rise of the half of the power supply voltage.

More preferably, the control circuit includes tenth and eleventh transistors of the first conductivity type connected in series between the power supply and the first electrode of the sixth transistor, and conducting during a predetermined period after turn-on of the power supply to apply to the first electrode of the sixth transistor a voltage lower than the power supply voltage by a threshold voltage of the eleventh transistor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
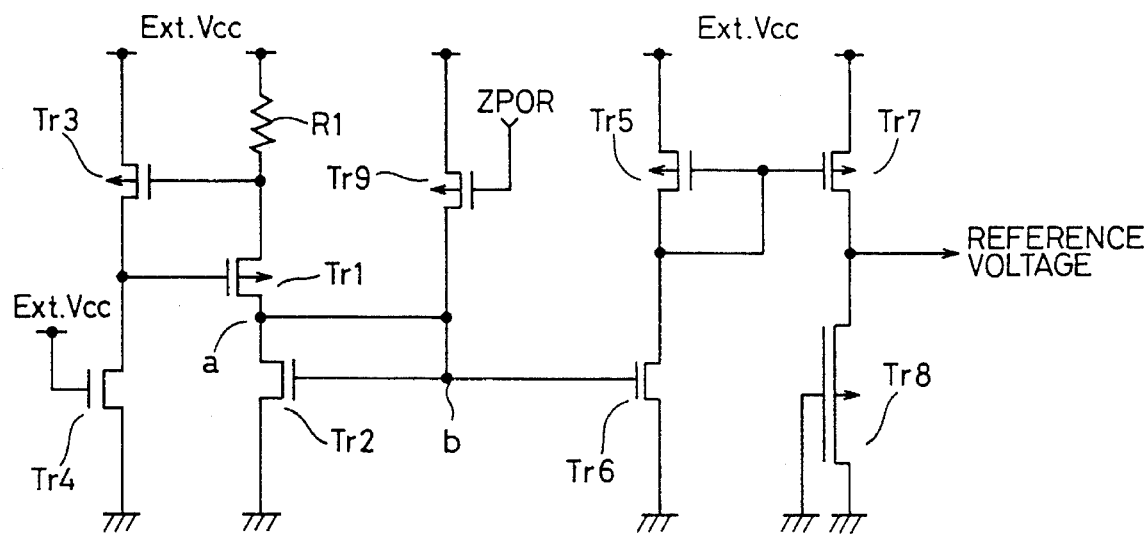
FIG. 1 is a schematic diagram of a circuit in accordance with one embodiment of the present invention.
Figure 10:
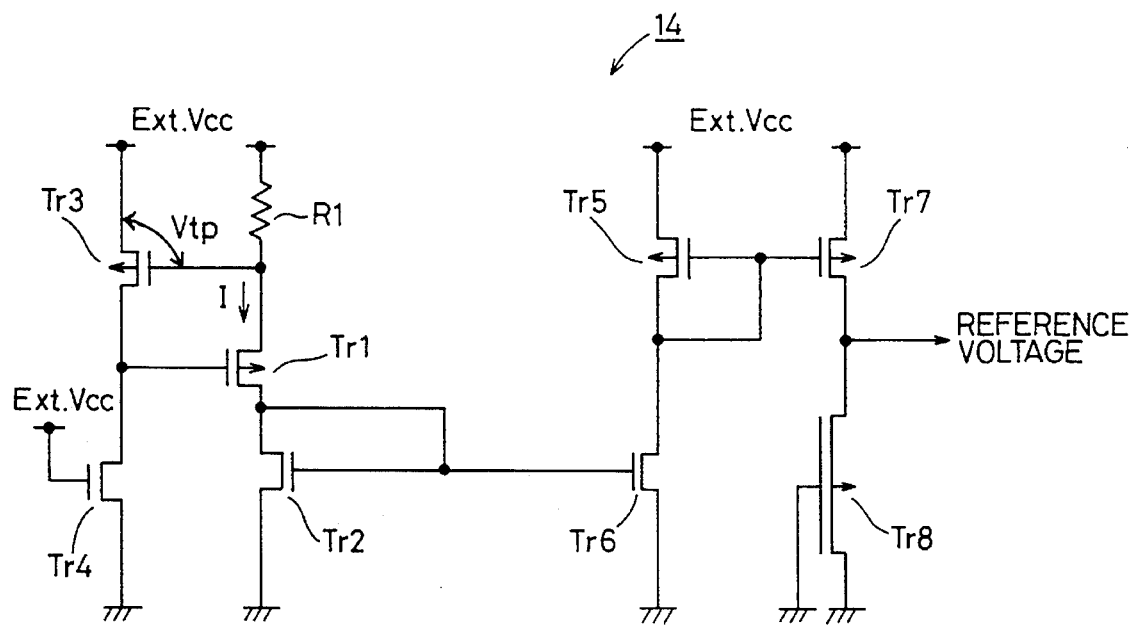
FIG. 10 is a schematic diagram of a conventional reference voltage generating circuit.
Figure 11:
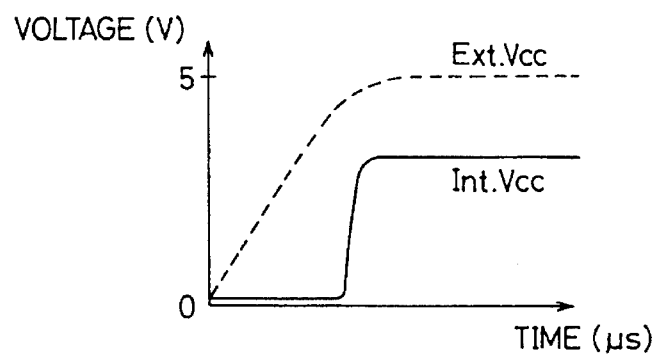
FIG. 11 is a graph showing rising characteristics of the internal power supply voltage Int.Vcc generated from the external power supply voltage Ext.Vcc based on a reference voltage generated from the reference voltage generating circuit shown in FIG. 10.

FIG. 1 is a schematic diagram of circuit in one embodiment of the present invention. In FIG. 1, the reference voltage generating circuit is structured similarly to the conventional one shown in FIG. 10 except provision of a p-channel transistor Tr9. The gate of transistor Tr9 is supplied with a zero-power on reset signal ZPOR attaining an L (logical low) level only during a predetermined period after turn-on of the power supply, and rising to an H (logical high) level after the period has passed. The zero-power on reset signal ZPOR is provided from zero-power on reset signal generation circuit 15 provided within the DRAM shown in FIG. 8. The drain of transistor Tr9 is supplied with the external power supply voltage Ext.Vcc, and the source of transistor Tr9 is connected to the drain of transistor Tr1 and the gate of transistor Tr2.

Figure 2:
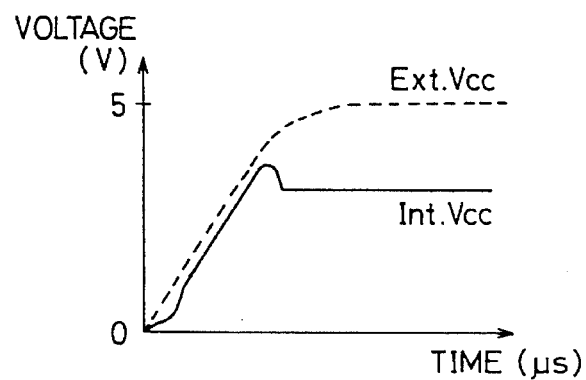
FIG. 2 is a graph showing rising characteristics of an external power supply voltage Ext.Vcc and an internal power supply voltage Int.Vcc generated based on a reference voltage generated in the embodiment shown in FIG. 1.

FIG. 2 is a graph showing rising characteristics of the internal power supply voltage Int.Vcc generated based on a reference voltage generated in the embodiment shown in FIG. 1, and the external power supply voltage Ext.Vcc.

In the reference voltage generating circuit shown in FIG. 1, upon turn-on of the power supply, the zero-power on reset signal ZPOR attains an L level. Transistor Tr9 is then rendered conductive, and the external power supply voltage Ext.Vcc is applied to nodes a and b, respectively. As a consequence, transistor Tr6 is rendered conductive, causing a current flow through transistors Tr5 and Tr6, and thus through transistors Tr7 and Tr8, so that a reference voltage rises, following the rise of the external power voltage Ext.Vcc. The zero-power on reset signal ZPOR attains an H level after a predetermined period, rendering transistor Tr9 non-conductive. After the external power supply voltage Ext.Vcc attains a certain level, the circuit operates similarly to the above-mentioned conventional one in FIG. 10.

According to the present embodiment, therefore, when the external power supply voltage Ext.Vcc rises as indicated by the dotted line of FIG. 2 after turn-on of the power supply, the reference voltage rises smoothly following the rise of the external power supply voltage. Accordingly, the internal power supply voltage Int.Vcc generated based on the reference voltage also rises smoothly, as indicated by the solid line of FIG. 2, following the rise of the external power supply voltage Ext.Vcc, and becomes constant after a predetermined time period.

Figure 3:
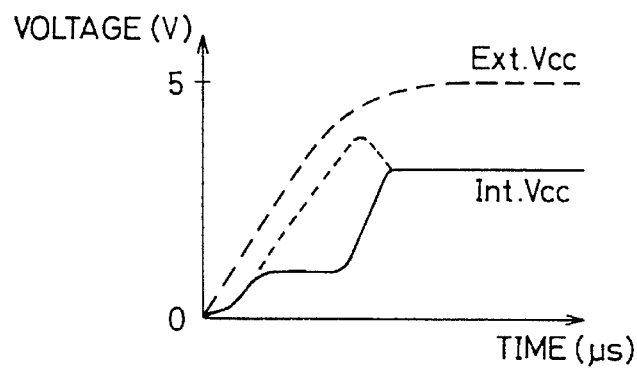
FIG. 3 is a graph showing improvement of the embodiment shown in FIG. 1.

FIG. 3 is a graph showing improvement of the embodiment shown in FIG. 1. In the embodiment of FIG. 1, the gate of transistor Tr9 is supplied with the zero-power on reset signal ZPOR, which attains an L level upon turnon of the power supply, and becomes H after a predetermined time period. As a result, the internal power supply voltage Int.Vcc overshoots, as indicated by the solid line of FIG. 2. However, if the gate of transistor Tr9 is supplied with the reference voltage, the internal power supply voltage Int.Vcc will not overshoot as shown in FIG. 3.

Figure 4:
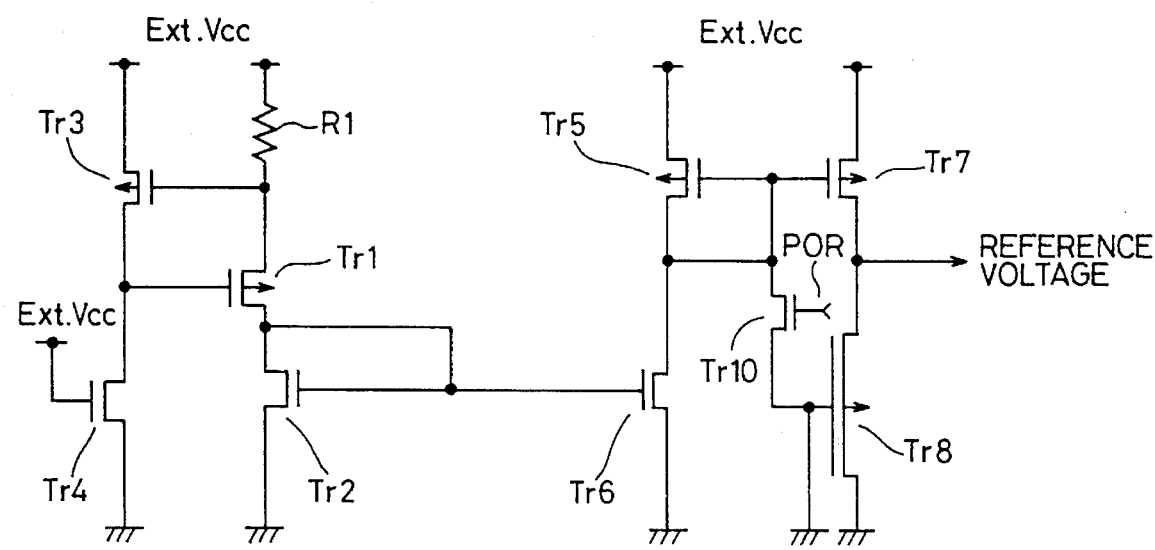
FIG. 4 is a schematic diagram of a circuit shown in another embodiment of the present invention.
Figure 5:
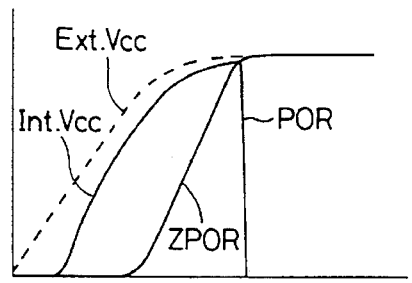
FIG. 5 is a graph showing the operation of the embodiment shown in FIG. 4.

FIG. 4 is a schematic diagram of a circuit in another embodiment of the present invention, and FIG. 5 is a graph showing a power on reset signal POR employed in the embodiment of FIG. 4.

Figure 8:
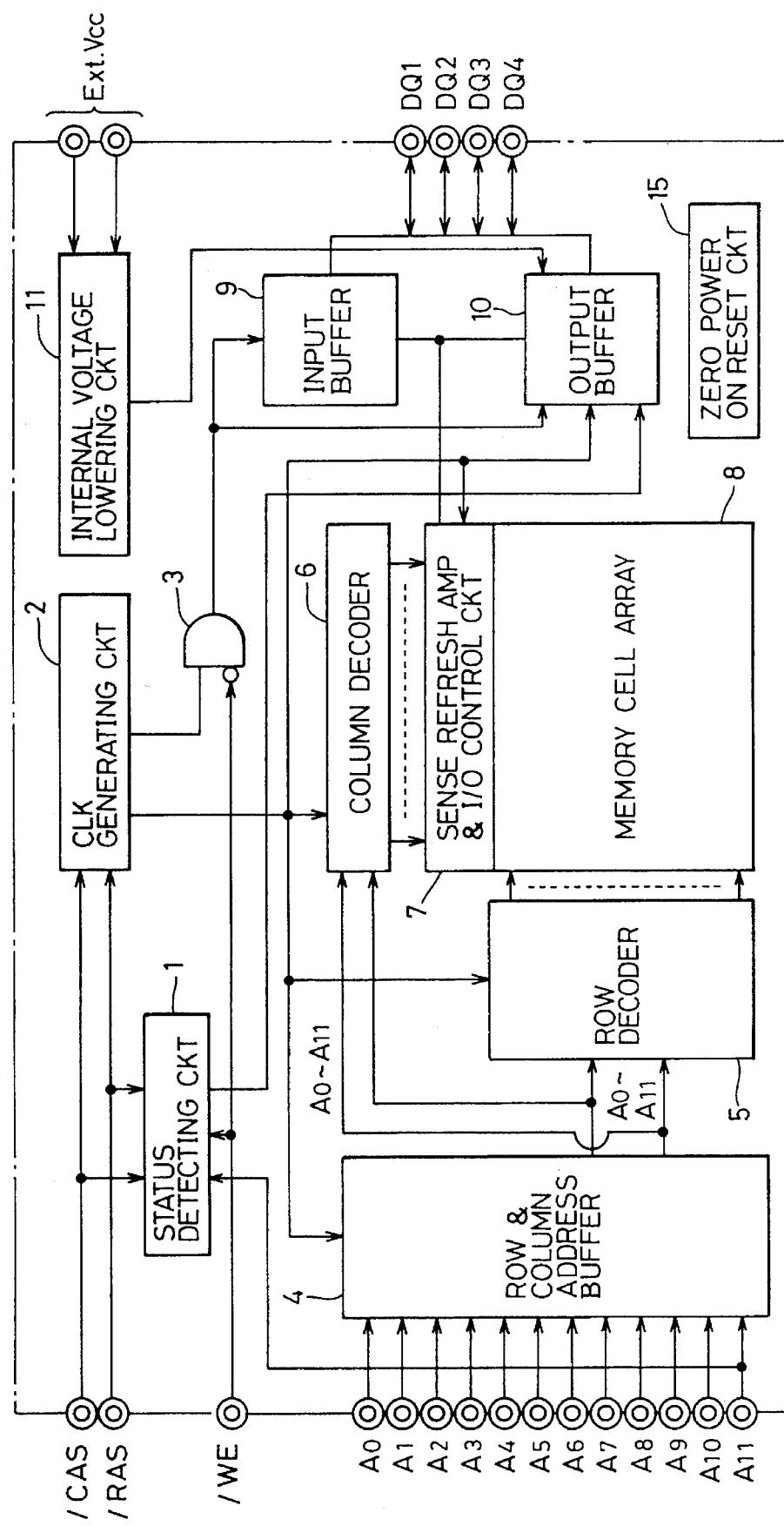
FIG. 8 is a block diagram showing one example of a conventional DRAM.
Figure 9:
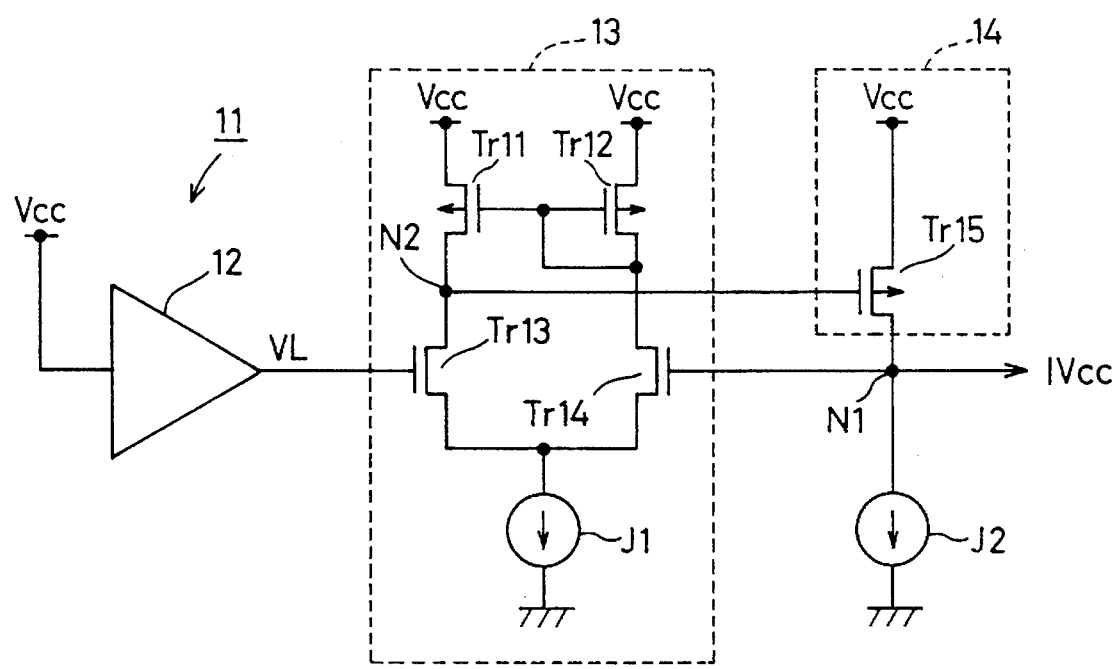
FIG. 9 is a schematic diagram showing one example of the internal voltage-down lowering circuit shown in FIG. 8.

The embodiment shown in FIG. 4 corresponds to the conventional circuit shown in FIG. 8 with an n-channel transistor Tr10 added thereto. n-channel transistor Tr10 has its drain connected to the drain and the gate of transistor Tr5, and has its source grounded. The gate of transistor Tr10 is supplied with the power on reset signal POR. The power on reset signal POR is an inversion of the zero-power on reset signal ZPOR described with reference to FIG. 1. As shown in FIG. 5, the power on reset signal POR is at an H level a predetermined period after turn-on of the power supply, and becomes L after the predetermined period. Upon turn-on of the power supply, transistor Tr10 conducts, rendering the gate of transistor Tr7 at an L level. This allows transistor Tr7 to conduct, so that the reference voltage rises smoothly, following the rise of the external power supply voltage Ext.Vcc. Therefore, when the internal power supply voltage Int.Vcc is generated from the external power supply voltage Ext.Vcc, based on the reference voltage generated in the present embodiment, the internal power supply voltage Int.Vcc can rise smoothly, following the rise of the external power supply voltage Ext.Vcc, thereby preventing a latch-up.

In the embodiment shown in FIG. 1, the zero-power on reset signal, which attains a ground level upon turn-on of the power supply, is applied to the gate of n-channel transistor Tr 9, rendering node b at the level of the external power supply voltage Ext.Vcc, so as to force transistor Tr6 to conduct. In this method, transistor Tr9 purely conducts because its gate is at a ground level, thereby applying a potential at the external power supply voltage Ext.Vcc level to the gate of transistor Tr6. This allows transistor Tr6 to purely conduct, so that a feedthrough current flows between the terminal of the external power supply voltage Ext.Vcc and the ground through transistor Tr9 and transistor Tr6. In the embodiment shown in FIG. 4, to the contrary, the gate of transistor Tr6 is not fixed to the level of the external power supply voltage Ext.Vcc, so that a feedthrough current will not flow through transistor Tr6. Although a feedthrough current flows through transistors Tr7 and Tr8 also in this embodiment, the amount thereof will not be so large because of the small current drivability of transistor Tr8.

Figure 6:
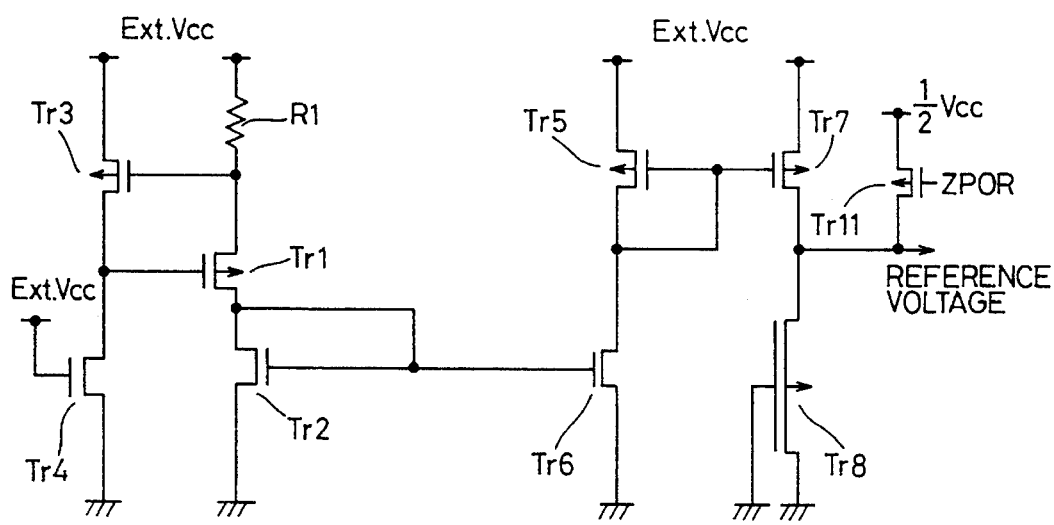
FIG. 6 is a schematic diagram of a circuit in still another embodiment of the present invention.

FIG. 6 is a schematic diagram of a circuit in still another embodiment of the present invention. In this embodiment, the source and the drain of a p-channel transistor Tr11 are connected between the output terminal of the reference voltage and a ½ Vcc line, and the gate thereof is supplied with the zero-power on reset signal ZPOR. Transistor Tr11 conducts when the zero-power on reset signal ZPOR becomes L upon turn-on of the power supply, so as to provide ½ Vcc as the reference voltage, preventing a feedthrough current from flowing as in the embodiment shown in FIG. 1. In addition, overshoot which takes place in the embodiment shown in FIG. 1 can be prevented, since ½Vcc is provided as the reference voltage. Instead of Vcc, $V_{BL}$ or $V_{CP}$ may be employed.

Figure 7:
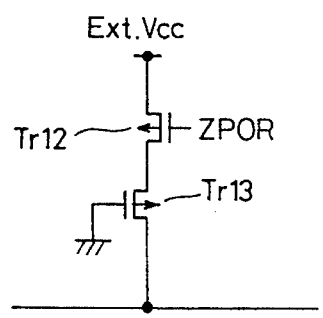
FIG. 7 is a schematic diagram showing the main part of a circuit in a further embodiment of the present invention.

FIG. 7 is a schematic diagram showing a further embodiment of the present invention. In the embodiment shown in FIG. 7, transistors Tr12 and Tr13 are substituted for transistor Tr11 of FIG. 6, which are connected in series between the terminal of the external power supply voltage Ext.Vcc and the output terminal of the reference voltage. The gate of transistor Tr12 is supplied with the zero-power on reset signal ZPOR, and the gate of transistor Tr13 is grounded.

In this embodiment, transistor Tr12 conducts upon turn-on of the power supply by the zero-power on reset signal ZPOR, so that a voltage lower than the external power supply voltage Ext.Vcc by a threshold voltage of transistor Tr13 is provided as the reference voltage. This embodiment also has an advantage that an initial value of the reference voltage can be set arbitrarily with the ratio of transistors Tr12 and Tr8.

As described above, according to the embodiment of the present invention, the reference voltage provided from the current mirror circuit upon turn-on of the power supply is controlled so as to follow the rising characteristics of the power supply, whereby latch-up does not takes place when the circuit is employed for generating an internal power supply voltage of a DRAM.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A reference voltage generating circuit of a semiconductor memory device, comprising:

a first circuit including a resistance, a first transistor of a first conductivity type, and a second transistor of a second conductivity type connected in series between a power supply and a ground;

a second circuit coupled to said first circuit for causing current to flow through said first circuit, a current mirror circuit including third and fourth transistors of the first conductivity type, first electrodes of the third and fourth transistors being connected to said power supply;

a fifth transistor of the second conductivity type, in which its input electrode is connected to a first electrode of the second transistor included in the first circuit, its first electrode is connected to a second electrode of the third transistor included in said current mirror circuit, and its second electrode is grounded;

a sixth transistor of the first conductivity type, in which its input electrode is grounded, its first electrode is connected to a second electrode of the fourth transistor included in said current mirror circuit, and provides a reference voltage, and its second electrode is grounded; and control means responsive to said power supply and coupled to said current mirror circuit, for causing the reference voltage provided from the first electrode of said sixth transistor on turn-on of said power supply to follow the rising characteristics of the power supply.

2. The reference voltage generating circuit of the semiconductor memory device according to claim 1, wherein said control means includes a control element for causing current flowing through said sixth transistor to rise in response to the rising characteristics of said power supply.

3. The reference voltage generating circuit of the semiconductor memory device according to claim 2, wherein said control element is coupled to the current mirror circuit via said fifth transistor, and said control element includes a transistor of the first conductivity type connected between the input electrode of said fifth transistor and said power supply, and conducting for a predetermined period after turn-on of the power supply, to apply a power supply voltage to the input electrode of the fifth transistor.

4. A reference voltage generating circuit of a semiconductor memory device comprising:

a first circuit including a resistance, a first transistor of a first conductivity type, and a second transistor of a second conductivity type connected in series between a power supply and a ground;

a second circuit coupled to said first circuit for causing current to flow through said first current, a current mirror circuit including third and fourth transistors of the first conductivity type, first electrodes of the third and fourth transistors being connected to said power supply;

a fifth transistor of the second conductivity type, in which its input electrode is connected to a first electrode of the second transistor included in the first circuit, its first electrode is connected to a second electrode of the third transistor included in said current mirror circuit, and its second electrode is grounded;

a sixth transistor of the first conductivity type, in which its input electrode is grounded, its first electrode is connected to a second electrode of the fourth transistor included in said current mirror circuit, and provides a reference voltage, and its second electrode is grounded; and control means responsive to said power supply and coupled to said current mirror circuit and to the ground, for causing the reference voltage provided from the first electrode of said sixth transistor on turn-on of said power supply to follow the rising characteristic of the power supply, wherein said control means includes a control element for causing current flowing through said sixth transistor to rise in response to the rising characteristics of said power supply, and wherein said control element includes a transistor of the second conductivity type connected between an input electrode of the fourth transistor included in said current mirror circuit and the ground, and conducting for a predetermined period after turn-on of the power supply, to render said fourth transistor conductive.

5. A reference voltage generating circuit of semiconductor memory device comprising:

a first circuit including a resistance, a first transistor of a first conductivity type and a second transistor of a second conductivity type connected in series between a power supply and a ground;

a second circuit coupled to said first circuit for causing current to flow through said first circuit, a current mirror circuit including third and fourth transistor of the first conductivity type, first electrodes of the third and fourth transistors being connected to said power supply;

a fifth transistor of the second conductivity type, in which its input electrode is connected to a first electrode of the second transistor included in the first circuit, its first electrode is connected to a second electrode of the third transistor included in said current mirror circuit, and its second electrode is grounded;

a sixth transistor of the first conductivity type, in which its input electrode is grounded, its first electrode is connected to a second electrode of the fourth transistor included in said current mirror circuit, and provides a reference voltage, and its second electrode is grounded; and controls means coupled to said current mirror circuit for causing the reference voltage provided from the first electrode of said sixth transistor on turn-on of said power supply to follow the rising characteristics of the power supply, wherein said control means includes a control element for causing current flowing through said sixth transistor to rise in response to the rising characteristics of said power supply, and wherein said control element includes a transistor of the first conductivity type whose first electrode is supplied with a voltage corresponding to a half of said power supply voltage, and whose second electrode is connected to a first electrode of said sixth transistor, and which conducts for a predetermined period after turn-on of the power supply to provide a reference voltage rising in response to the rise of said voltage corresponding to the half of the power supply voltage.

6. A reference voltage generating circuit of a semiconductor memory device comprising a first circuit including a resistance, a first transistor of a first conductivity type, and a second transistor of a second conductivity type connected in series between a power supply and a ground;

a second circuit coupled to said first circuit for causing current to flow through said first current, a current mirror circuit including third and fourth transistors of the first conductivity type, first electrodes of the third and fourth transistors being connected to said power supply;

a fifth transistor of the second conductivity type, in which its input electrode is connected to a first electrode of the second transistor included in the first circuit, its first electrode is connected to a second electrode of the third transistor included in said current mirror circuit, and its second electrode is grounded;

a sixth transistor of the first conductivity type, in which its input electrode is grounded, its first electrode is connected to a second electrode of the fourth transistor included in said current mirror circuit, and provides a reference voltage, and its second electrode is grounded; and control means coupled to said current mirror circuit causing the reference voltage provided from the first electrode of said sixth transistor on turn-on of said power supply to follow the rising characteristics of the power supply, wherein said control means includes control elements for causing current flowing through said sixth transistor to rise in response to the rising characteristics of said power supply, and wherein said control elements include seventh and eighth transistors of the first conductivity type connected in series between said power supply and a first electrode of said sixth transistor, said seventh transistor conducting for a predetermined period after turn-on of the power supply, to provide to the first electrode of said sixth transistor a voltage lower than the power supply voltage by a threshold voltage of said eighth transistor.

7. The reference voltage generating circuit of the semiconductor memory device according to claim 2, wherein said controls means further includes:

a control signal generating means for generating said control signal for said control element for a predetermined period after turn-on of the power supply.

* * * * *